United States Patent
Li et al.

(10) Patent No.: US 10,802,398 B2
(45) Date of Patent: Oct. 13, 2020

(54) TOUCH PANEL AND DIRECT PATTERNING METHOD THEREOF

(71) Applicant: TPK Touch Solutions Inc., Taipei (TW)

(72) Inventors: Chao-Sung Li, Hsinchu (TW);
Ho-Hsun Chi, Hsinchu County (TW);
Fang Fang, Xiamen (CN); Zheng-Pang Huang, Fujian Province (CN);
Chien-Hsien Yu, Zhubei (TW);
Chih-Min Chen, Taichung (TW);
Shan-Yu Wu, New Taipei (TW)

(73) Assignee: TPK TOUCH SOLUTIONS INC., Taipei (TW)

( * ) Notice: Subject to any disclaimer, the term of this patent is extended or adjusted under 35 U.S.C. 154(b) by 0 days.

(21) Appl. No.: 16/287,452

(22) Filed: Feb. 27, 2019

(65) Prior Publication Data

US 2019/0271912 A1  Sep. 5, 2019

(30) Foreign Application Priority Data

Mar. 2, 2018 (CN) .......................... 2018 1 0175902

(51) Int. Cl.
*G03F 7/00* (2006.01)
*G03F 7/30* (2006.01)
(Continued)

(52) U.S. Cl.
CPC .............. *G03F 7/0007* (2013.01); *G03F 7/30* (2013.01); *G06F 3/041* (2013.01); *G06F 3/0443* (2019.05); *H05K 3/027* (2013.01); *H05K 3/064* (2013.01); *G06F 3/0445* (2019.05); *G06F 3/0446* (2019.05); *G06F 3/04164* (2019.05); *G06F 2203/04103* (2013.01); *G06F 2203/04111* (2013.01); *H05K 2203/0793* (2013.01)

(58) Field of Classification Search
CPC ........ G03F 7/0007; G03F 7/30; G06F 3/0443; G06F 3/041; G06F 3/04164; G06F 3/0446; G06F 3/0445; G06F 2203/04111; G06F 2203/04103; H05K 3/027; H05K 3/064; H05K 2203/0793
See application file for complete search history.

(56) References Cited

U.S. PATENT DOCUMENTS 7,279,254 B2 * 10/2007 Zwadlo ..................... G03F 1/56
430/200
8,557,498 B2 * 10/2013 Yorisue ............... C08F 290/148
430/270.1

(Continued)

*Primary Examiner* — Vinh T Lam
(74) *Attorney, Agent, or Firm* — Winston Hsu

(57) ABSTRACT

The direct patterning method includes: providing a substrate having a display area and a peripheral area, which a peripheral circuit having a bonding pad is disposed on the peripheral area; sequentially disposing a metal nanowire layer, a pre-cured film layer and a negative-type photosensitive layer thereon; performing a photolithography step; and curing the pre-cured film layer. The photolithography step includes exposing the negative-type photosensitive layer to define a removal region and a reserved region; and removing the negative-type photosensitive layer, the pre-cured film layer and the metal nanowire layer in the removal region by using a developer, such that a touch sensing electrode is fabricated in the display area and the bonding pad is exposed.

7 Claims, 14 Drawing Sheets

(51) Int. Cl.
*G06F 3/041* (2006.01)
*H05K 3/02* (2006.01)
*H05K 3/06* (2006.01)
*G06F 3/044* (2006.01)

(56) References Cited

U.S. PATENT DOCUMENTS

| | | | |
|---|---|---|---|
| 8,709,552 B2* | 4/2014 | Miyoshi | C08G 73/10 428/1.1 |
| 2011/0213479 A1 | 9/2011 | Wahlsten et al. | |
| 2012/0073866 A1* | 3/2012 | Hirai | H05K 3/1275 174/257 |
| 2014/0035599 A1* | 2/2014 | Shimata | G01R 3/00 324/658 |
| 2014/0151325 A1* | 6/2014 | Baek | G06F 3/041 216/13 |
| 2014/0152910 A1* | 6/2014 | Kang | G06F 1/1652 349/12 |
| 2014/0198266 A1* | 7/2014 | Park | H05K 1/097 349/12 |
| 2014/0232950 A1* | 8/2014 | Park | G06F 3/044 349/12 |
| 2015/0109246 A1* | 4/2015 | Lee | G06F 3/044 345/174 |
| 2015/0169113 A1* | 6/2015 | Ito | G06F 3/041 345/174 |
| 2015/0253903 A1* | 9/2015 | Lee | G06F 3/0416 345/174 |
| 2016/0034081 A1* | 2/2016 | Ichiki | H05K 1/115 345/173 |
| 2016/0034096 A1* | 2/2016 | Chen | G06F 3/03547 345/174 |
| 2016/0154516 A1* | 6/2016 | Park | G06F 3/041 345/173 |
| 2016/0170512 A1* | 6/2016 | Park | G06F 3/044 345/173 |
| 2016/0179234 A1* | 6/2016 | Dan | G06F 3/041 345/174 |
| 2016/0224153 A1* | 8/2016 | Bae | G06F 3/044 |
| 2016/0224154 A1* | 8/2016 | Kang | G06F 3/044 |
| 2016/0246415 A1* | 8/2016 | Bae | G06F 3/044 |
| 2016/0320874 A1* | 11/2016 | Park | G06F 3/044 |
| 2017/0038876 A1* | 2/2017 | Yang | G06F 3/044 |
| 2017/0115800 A1* | 4/2017 | Lee | G06F 3/044 |
| 2017/0177148 A1* | 6/2017 | Lee | G06F 3/044 |
| 2017/0205917 A1* | 7/2017 | Yamaoka | B32B 27/306 |
| 2017/0277292 A1* | 9/2017 | Park | G02F 1/13338 |
| 2017/0308232 A1* | 10/2017 | Park | G06F 3/0416 |
| 2017/0329436 A1* | 11/2017 | Choi | G02F 1/1343 |
| 2017/0344152 A1* | 11/2017 | Yu | B32B 27/06 |
| 2018/0232077 A1* | 8/2018 | Chen | G06F 3/044 |
| 2018/0253170 A1* | 9/2018 | Noh | H05K 3/046 |
| 2019/0114003 A1* | 4/2019 | Gao | G06F 3/045 |
| 2019/0371830 A1* | 12/2019 | Hsiao | H01L 27/1259 |
| 2019/0384429 A1* | 12/2019 | Hsiao | B32B 15/02 |

* cited by examiner

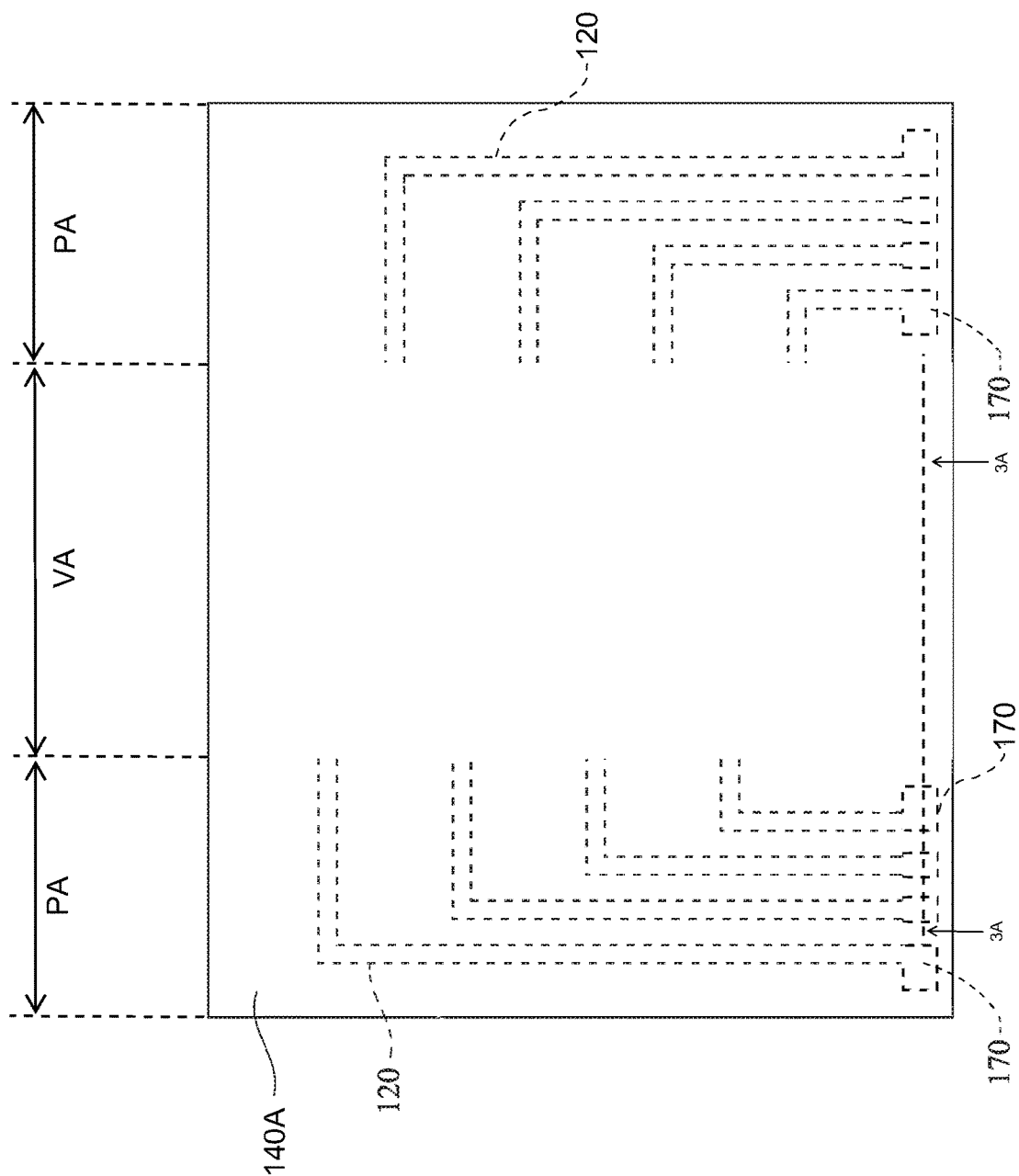

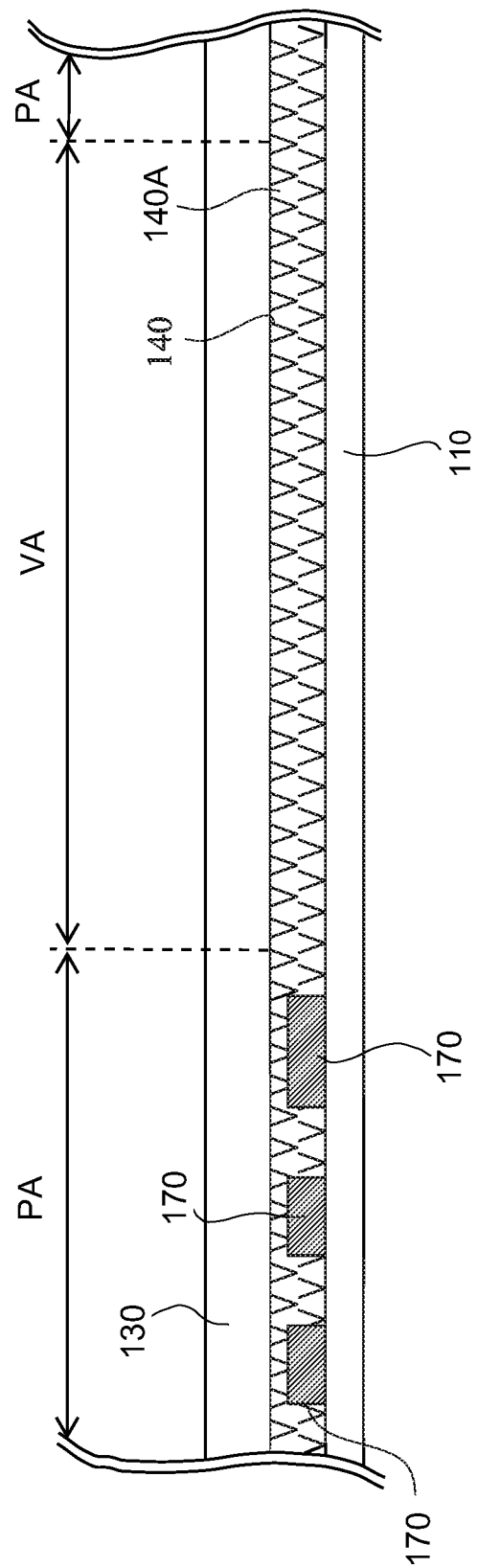

TOUCH PANEL AND DIRECT PATTERNING METHOD THEREOF

CROSS-REFERENCE TO RELATED APPLICATION

This application claims priority to Chinese Application Serial Number CN 201810175902.7, filed 2018 Mar. 2, which is herein incorporated by reference.

BACKGROUND

Field of Invention

The present disclosure relates to a touch panel and a direct patterning method thereof.

Description of Related Art

Transparent conductors, because of their excellent light transmittance and electrical conductivity, are often used in display applications, such as touch-sensing screens. Generally, the transparent conductors may be made of various metal oxides, such as indium tin oxide (ITO), indium zinc oxide (IZO), cadmium tin oxide (CTO), or aluminum-doped zinc oxide (AZO). The metal oxide thin film may be formed by physical vapor deposition (PVD) or chemical vapor deposition (CVD), and patterns in the metal oxide thin film may be formed by a laser ablation process. However, these metal oxide thin films may not meet a flexibility requirement. In some cases, patterned metal oxide thin films may also have visible pattern boundaries, which adversely affect the viewing experience. Transparent conductors based on, e.g. nanowires, are being developed at least partially in response to these problems.

However, in the fabrication process of touch electrodes using nanowire-containing material, there are many obstacles that have to be solved. These obstacles are associated with the process and configuration of the nanowire and the metal leads in the peripheral area. For instance, in the conventional techniques, the nanowire material is coated in the display area and the peripheral area, and the metal leads in the peripheral area are covered by the nanowire material. The nanowire material is patterned and etched by using an etchant solution to fabricate touch sensing electrodes in the display area. Etchant solution may corrode the metal leads, and therefore the product reliability is decreased. In addition, an additional cleaning process is required to remove the remaining etching liquid.

Furthermore, an overcoat is coated on the nanowires in the fabricating process of nanowire-containing touch sensing electrode. Since the etching liquid can remove only the nanowire, the overcoat remains after the abovementioned etching process. A trade-off between the electrode protection and the contact impedance may occur due to the thickness of the remaining overcoat. Specifically, in order to increase the protection provided to the electrode, the thickness of the remaining overcoat is preferably large. However, if the thickness of the remaining overcoat on the bonding pad is too large (for example, greater than 20 nm) after the etching process, the contact impedance between the bonding pad and the exterior circuit board is too high, thereby causing signal loss or signal distortion. In other words, the product may encounter some electrical performance issues caused by the large thickness of the remaining overcoat that is sandwiched between the bonding pads and the exterior circuit board. On the other hand, in order to decrease the contact impedance, the thickness of the remaining overcoat is preferably decreased. However, if the thickness of the remaining overcoat on the nanowire for forming touch sensing electrode is too low after the etching process, the protection provided to the nanowire is insufficient. In other words, the small thickness of the remaining overcoat may lead to the low durability of the product.

Therefore, in order to improve product performance, the fabrication process and the configuration of the nanowire-containing touch sensing electrode have to be redesigned in a way that is based on the characteristics properties of materials.

SUMMARY

In some embodiments of the present disclosure, the durability of the touch sensing electrodes in the display area is increased. Meanwhile, a low-impedance electrical path is formed by the direct contact structure between the bonding pads and electrode pads of an exterior circuit board. Moreover, in some embodiments of the present disclosure, a direct patterning method of touch electrode is provided for fabricating a novel touch panel structure.

In some embodiments of the present disclosure, a direct patterning method of a touch panel is provided. The direct patterning method includes: providing a substrate having a display area and a peripheral area, in which a peripheral circuit having a bonding pad is disposed in the peripheral area; disposing a metal nanowire layer in the display area and the peripheral area, in which the metal nanowire layer has a plurality of metal nanowires; disposing a pre-cured film layer on the metal nanowire layer; disposing a negative-type photosensitive layer on the pre-cured film layer; performing a photolithography step that includes exposing the negative-type photosensitive layer to define a removal region and a reserved region, and removing the negative-type photosensitive layer, the pre-cured film layer, and the metal nanowire layer in the removal region by using of a developer, such that a touch sensing electrode is fabricated on the display area, and the bonding pad in the peripheral area is exposed, the touch sensing electrode being electrically connected to the peripheral circuit, in which the touch sensing electrode consists of the pre-cured film layer and the metal nanowire layer, while the pre-cured film layer and the metal nanowire layer in the reserved region are covered by the negative-type photosensitive layer; and curing the pre-cured film layer.

In some embodiments of the present disclosure, the direct patterning method further includes a post-processing step to completely remove the metal nanowire layer in the removal region.

In some embodiments of the present disclosure, the post-processing step includes using an organic solution or an alkaline solution in a mechanical approach to completely remove the metal nanowire layer in the removal region.

In some embodiments of the present disclosure, the post-processing step includes using an adhesive to completely remove the metal nanowire layer in the removal region.

In some embodiments of the present disclosure, the post-processing step includes using a microwave radiation process or a UV radiation process to completely remove the metal nanowire layer in the removal region.

In some embodiments of the present disclosure, a photo-sensitivity of the negative-type photosensitive layer is greater than that of the film.

In some embodiments of the present disclosure, an adhesion strength between the negative-type photosensitive layer and a structure having the pre-cured film layer and the metal nanowire layer is greater than an adhesion strength between the substrate and the structure having the pre-cured film layer and the metal nanowire layer.

In some embodiments of the present disclosure, a touch panel is provided. The touch panel includes a substrate having a display area and a peripheral area; a metal nanowire layer, a film and a negative-type photosensitive layer sequentially disposed on the substrate; and a peripheral circuit disposed in the peripheral area of the substrate. The peripheral circuit has a bonding pad. The negative-type photosensitive layer has a removal region and a reserved region which are defined by exposing the negative-type photosensitive layer. The negative-type photosensitive layer, the film, and the metal nanowire layer in the removal region are removed to define a touch sensing electrode and expose the bonding pad. The touch sensing electrode is electrically connected to the peripheral circuit.

In some embodiments of the present disclosure, the metal nanowire layer includes a plurality of metal nanowires. The metal nanowires are embedded in the film in the reserved region and form a conductive network. The touch sensing electrode is formed of the film and the metal nanowires in the display area. The touch sensing electrode is covered by the remaining negative-type photosensitive layer.

In some embodiments of the present disclosure, a photosensitivity of the negative-type photosensitive layer is greater than that of the film.

In some embodiments of the present disclosure, a thickness of the film ranges from about 200 nm to 400 nm.

According to some embodiments of the present disclosure, a lap joint structure between the metal nanowire layer and the peripheral circuit is formed at an interface of the display area and the peripheral area. For example, the lap joint structure is a connection structure where the metal nanowire layer climbs onto the peripheral circuit.

In some embodiments of the present disclosure, the touch sensing electrode extends to the peripheral area and covers the peripheral circuit, and the bonding pad is not covered by the touch sensing electrode. In other words, the bonding pad is exposed form the touch sensing electrode.

In some embodiments of the present disclosure, the touch sensing electrode comprises a first electrode and a second electrode, and a non-conductive region is formed between the first electrode and the second electrode.

In some embodiments of the present disclosure, the non-conductive region is a gap, or the non-conductive region includes the metal nanowires having a concentration lower than a percolation threshold.

In some embodiments of the present disclosure, the non-conductive region is formed between adjacent peripheral circuits. In other words, the non-conductive region is formed between a first peripheral electrode of the peripheral circuit and a second peripheral electrode of the peripheral circuit.

BRIEF DESCRIPTION OF THE DRAWINGS

FIG. 3 is a schematic top view according to step S1 of the manufacturing method in FIG. 1.

FIG. 4A is a schematic sectional view along line 4A-4A of FIG. 4.

DETAILED DESCRIPTION

The following embodiments are disclosed with accompanying diagrams for a detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As used herein, "around," "about," or "approximately," shall generally mean within 20 percent, within 10 percent or within 5 percent of a given value or range. Numerical quantities given herein are approximate, meaning that the term "around," "about," or "approximately," can be inferred if not expressly stated. In addition, the following terms: "overcoat (OC layer)," "polymer," "pre-cured film layer," and "film layer" used herein is refer to an identical or similar element in different curing states. For ease of describing, these terms may be interchangeably used in the present disclosure.

Figure 1:
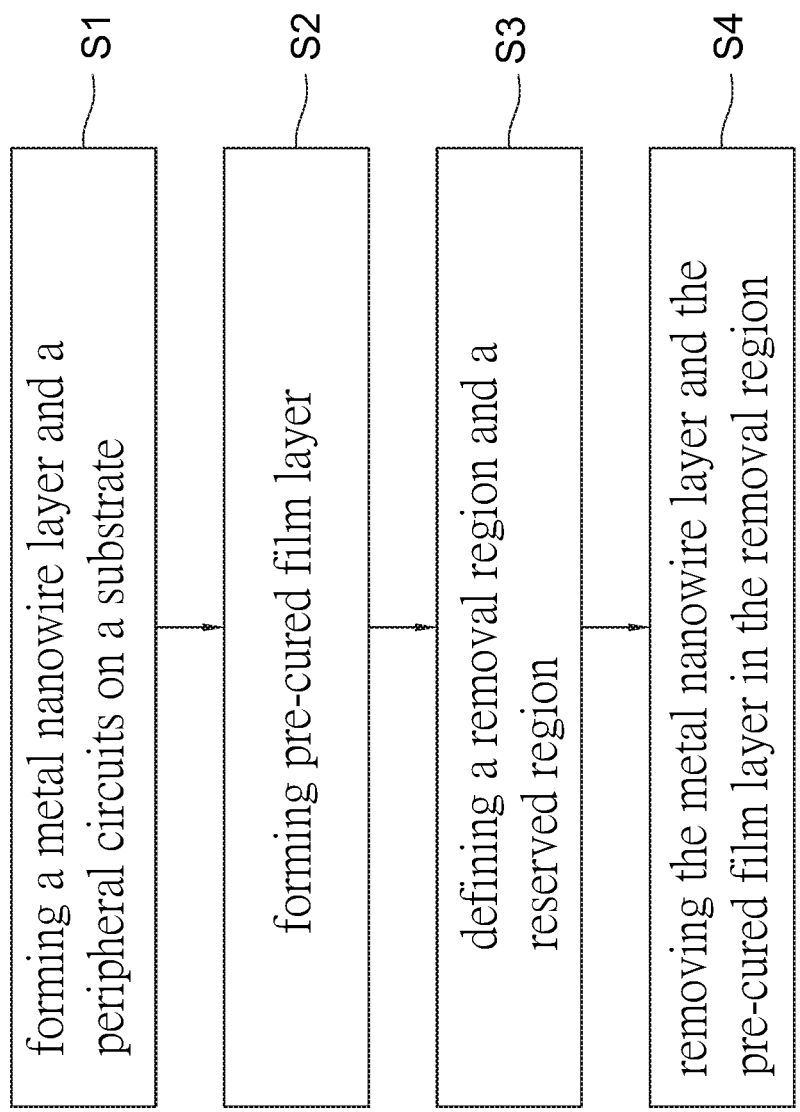
FIG. 1 is a flow chart of a manufacturing method of a touch panel according to some embodiments of the present disclosure.
Figure 2:
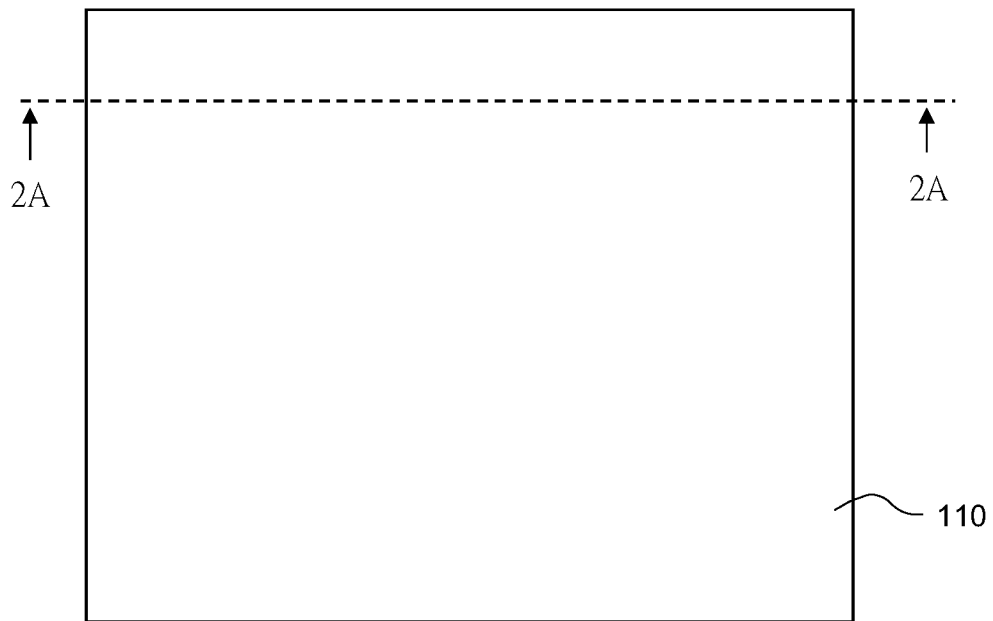
FIG. 2 is a schematic top view of a substrate according to some embodiments of the present disclosure.
Figure 2A:
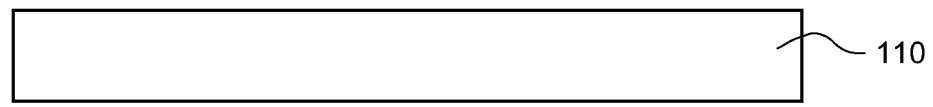
FIG. 2A is a schematic sectional view along line 2A-2A of FIG. 2.

FIG. 1 is a flow chart of a direct patterning method of a touch panel according to some embodiments of the present disclosure. The direct patterning method according to the embodiments includes the following steps. First, referring to FIG. 2 and FIG. 2A, a substrate 110 is provided. In some embodiments of the present disclosure, the substrate 110 is a transparent substrate, which may be a rigid transparent substrate or a flexible transparent substrate. The substrate 110 may be made from a transparent material, such as glass, polymethylmethacrylate (PMMA), polyvinyl chloride (PVC), polypropylene (PP), polyethylene terephthalate (PET), polyethylene naphthalate (PEN), polycarbonate (PC), or polystyrene (PS).

Figure 3A:
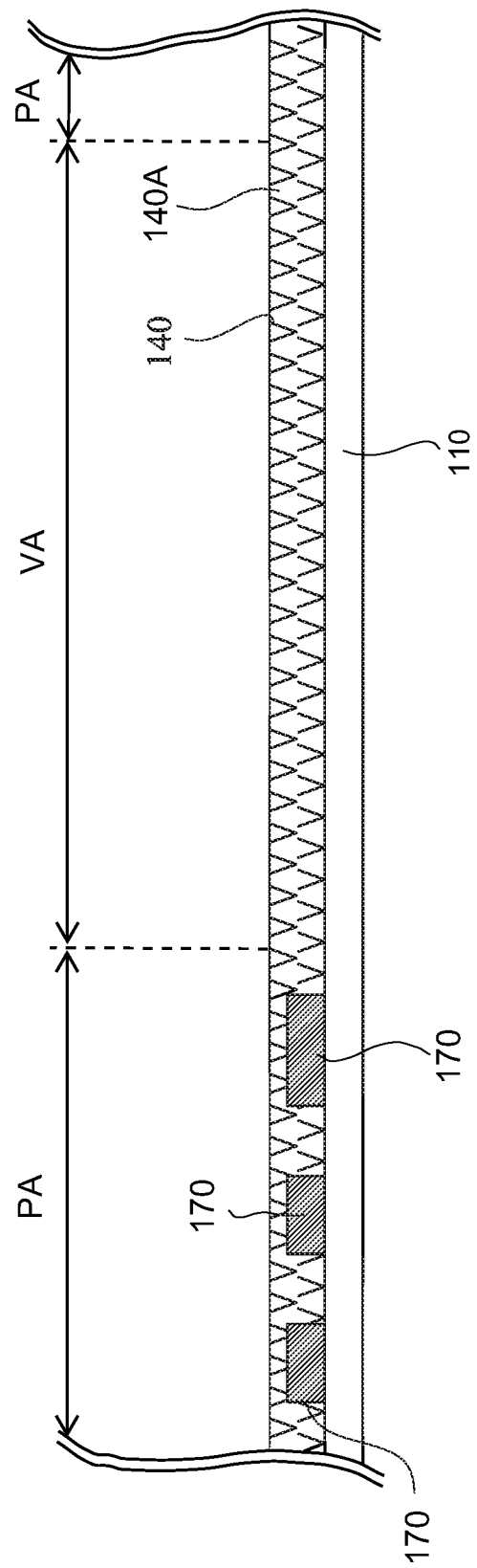
FIG. 3A is a schematic sectional view along line 3A-3A of FIG. 3.

Next, at step S1, as shown in FIG. 3 and FIG. 3A, a metal nanowire layer 140A and one or more peripheral circuits 120 are fabricated on the substrate 110. The metal nanowire layer 140A may at least include a plurality of metal nanowires 140. Specifically, in the present embodiment, a high conductive metal (for example, a single silver layer, a single copper layer, or a multilayer material, such as a molybdenum/aluminum/molybdenum) is formed in a peripheral area PA, which is predefined on the substrate 110. In one embodiment, the metal layer is patterned as one or more peripheral circuits 120 in the peripheral area PA. On the other hand, each peripheral circuit 120 has a connecting portion, namely a bonding pad 170 at one end thereof. Next, a dispersion or ink containing the metal nanowires 140 is coated on the substrate 110 and then dried to form a layer covering the substrate 110. In other words, the metal nanowire layer 140A of the metal nanowires 140 is formed on the substrate 110 by at least one of a drying or curing process.

The substrate 110 has a peripheral area PA and a display area VA defined thereon, and the peripheral area PA is disposed on the side of the display area VA. For example, as shown in FIG. 3, the peripheral area PA is disposed in regions that are on the left side and the right side of the display area VA. In another example, however, the peripheral area PA is defined as a frame-shaped region surrounding the display area VA (i.e., surrounding the left side, right side, upper side, and bottom side of the display area VA). Alternatively, the peripheral area PA is disposed in an L-shaped region of two adjacent sides of the display area VA. The metal nanowire layer 140A may include a first portion in the display area VA and a second portion in the peripheral area PA. More specifically, in the display area VA, the first portion of the metal nanowire layer 140A may be directly formed on a surface of the substrate 110. In the peripheral area PA, the second portion of the metal nanowire layer 140A may be formed on a surface of the substrate 110 and covers the peripheral circuit 120 as well as the bonding pad 170.

In one example of the present disclosure, the solvent of the dispersion may be water, alcohols, ketones, ethers, hydrocarbons, or an aromatic solvent (such as benzene, toluene, and xylene, but not limited thereto). The dispersion may include additives, surfactants or adhesives, such as carboxymethyl cellulose (CMC), hydroxyethyl cellulose (HEC), hydroxypropyl methylcellulose (HPMC), sulfonate ester, organosulfate, disulfonate, sulfosuccinic acid ester, organophosphate, or a fluorine-containing surfactant, but not limited thereto. The metal nanowire layer may be, for example, a silver nanowire layer, a gold nanowire layer, or a copper nanowire layer. More specifically, the term "metal nanowire(s)" in the present disclosure is a collective noun that refers to a set of metal wires including a plurality of elemental metals, metal alloys, or metal compounds (including metal oxides). The number of metal nanowires does not limit the scope of the present disclosure. A dimension of at least one cross-sectional area of the metal nanowires (i.e., the diameter of the cross-sectional area) is below 500 nm, below 100 nm or below 50 nm. The so-called "wire(s)" of the metal nanostructure in the present disclosure has a high aspect ratio, such as 10 to 100,000. Specifically, the aspect ratio (i.e., the ratio of the length to the diameter of the cross-sectional area) of the metal nanowires may greater than 10, greater than 50 or greater than 100. The metal nanowires may be made of metal, including but not limited to silver, gold, copper, nickel, and a silver material coated with gold. Other terms such as "silk," "fiber," or "tube" having a dimension and an aspect ratio within the aforementioned value ranges are also included in the scope of the present disclosure.

The dispersion or ink containing the metal nanowires 140 may be coated on the substrate 110 by a suitable process known in the art, including but not limited to a screen printing process, a spray coating process, or a roller coating process. In one example, the dispersion or ink containing the metal nanowires 140 may be coated on the substrate 110 by using a roll-to-roll process.

In some embodiments of the present disclosure, the metal nanowires 140 may include silver nanowires or silver nanofibers. The metal nanowires 140 may have an average diameter of about 20 nm to 100 nm and an average length of about 20 µm to 100 µm (i.e., the aspect ratio is about 1000). In one embodiment, the metal nanowires 140 may have an average diameter of about 20 nm to 70 nm and an average length of about 20 µm to 70 µm. In some embodiments, the average diameter of the metal nanowires 140 ranges from 70 nm to 80 nm, and the average length of the metal nanowires 140 is about 8 µm.

Figure 4:
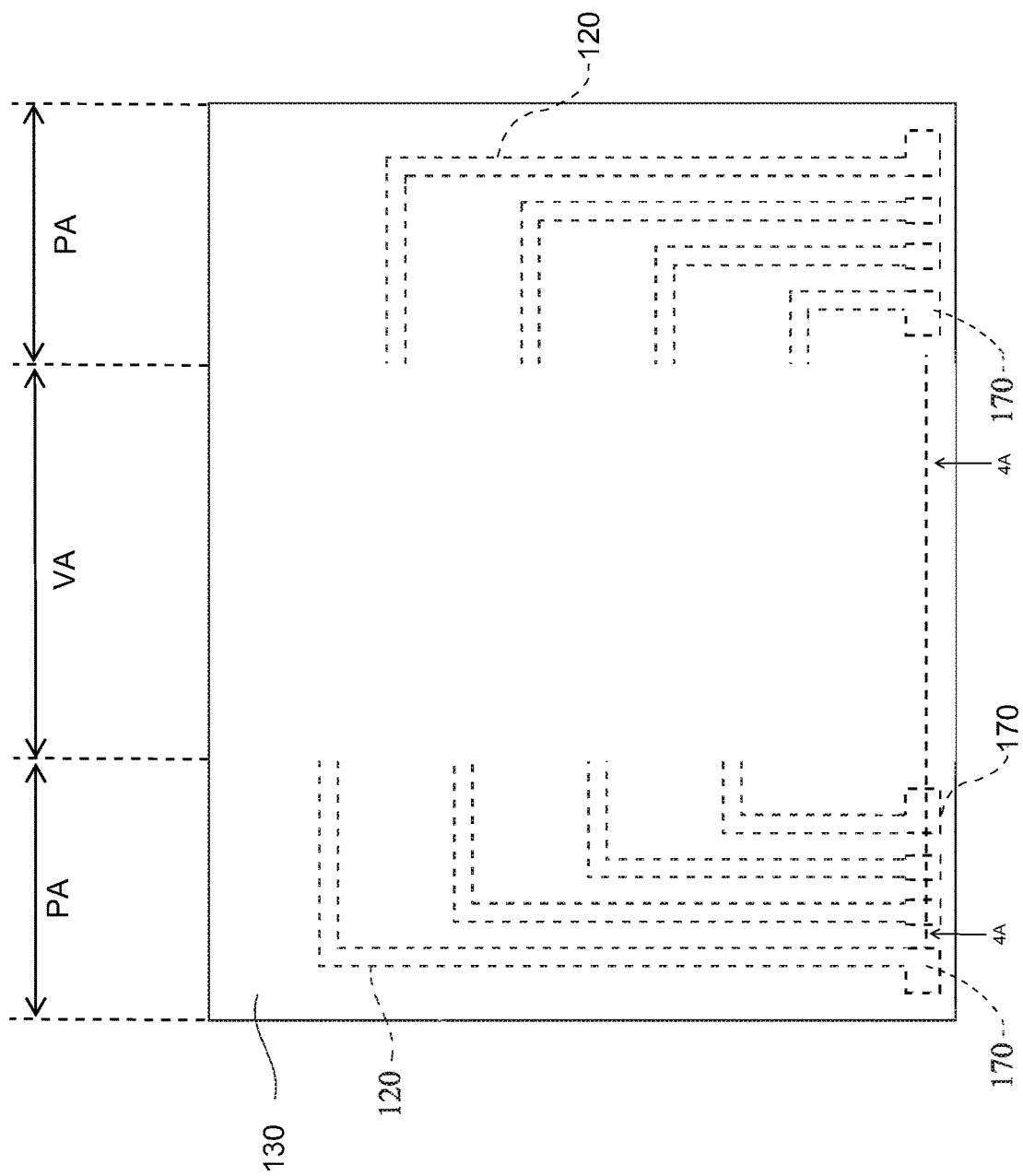
FIG. 4 is a schematic top view according to step S2 of the manufacturing method in FIG. 1.

At step S2 shown in FIG. 4 and FIG. 4A, a pre-cured film layer 130 is disposed on the metal nanowire layer 140A. Specifically, the pre-cured film layer 130 that is disposed on the metal nanowire layer 140A is formed by coating a material including a suitable polymer or a mixture thereof on the substrate 110, followed by performing a pre-curing step, but not limited thereto. More specifically, the pre-cured film layer 130 includes a first portion coated in the display area VA and a second portion coated in the peripheral area PA. The first portion of the pre-cured film layer 130 is formed on the first portion of the metal nanowire layer 140A correspondingly. The second portion of the pre-cured film layer 130 is formed on the second portion of the metal nanowire layer 140A correspondingly. In another example, a suitable polymer or a mixture thereof may be coated on the substrate 110, such that the polymer or the mixture thereof may penetrate into the space between the metal nanowires 140 to serve as a filler or a matrix between the metal nanowires. Then, a pre-curing step is performed to partially solidify the polymer so as to form the pre-cured film layer 130. In other words, the metal nanowires 140 may be deemed as embedding in the pre-cured film layer 130. In one example, the pre-curing step may be at least one of a heating or baking step (under a temperature of about 60° C. to about 150° C.), such that the polymer or the mixture thereof may be partially cured to form a pre-cured edge film layer 130, and the pre-cured film layer 130 covers the metal nanowire layer 140A. The physical structure of the pre-cured film layer 130 and the metal nanowire layer 140A is various. For example, the pre-cured film layer 130 and the metal nanowire layer 140A may be a double-layered laminate. Alternatively, the pre-cured film layer 130 and the metal nanowire layer 140A may be combined with each other to integrally form a composite layer. In one embodiment, the metal nanowires 140 are embedded in the pre-cured film layer 130 so as to form a composite electrode layer (which is referred as "composite structure (CS)" hereinafter) in the subsequent processes.

The polymer may include, but not limited to polyacrylic resins, such as polymethacrylates (for example, polymethylmethacrylate), polyacrylates, and polyacrylonitrile; polyvinyl alcohol; polyester (for example, polyethylene terephthalate (PET), polyester naphthalate, and polycarbonate); a polymer having a high aromaticity, such as phenolic resins, cresol-formaldehyde, polystyrene, polyvinyl toluene, polyvinylxylene, polyimide, polyamide, polyamideimide, polyetherimide, polysulfide, polysulfone, polyphenylene, and polyphenylene ether; polyurethane (PU); epoxy resin; polyolefins (for example, polypropylene, polymethylpentene, and cycloolefins); cellulose; polysilicone and other silicon-containing polymers (for example, polysilsesquioxanes and polysilanes); polyvinyl chloride (PVC); polyacetate ester; polynorbornene; synthetic rubber (for example, ethylene-propylene rubber (EPR), styrene-butadiene rubber (SBR), ethylene-propylene-diene monomer (EPDM) and fluorine-containing polymers (for example, polyvinylidene fluoride, polytetrafluoroethylene (TFE) or polyhexafluoropropylene)); a copolymer of fluorine-olefins and hydrocarbon olefin, and other similar non-conductive polymers. A photosensitive material may be added in the polymer to meet the requirement of patterning the pre-cured film layer 130 by a lithography process. In other examples, an inorganic material may be mixed with the photosensitive material to form the pre-cured film layer 130. For example, the inorganic material may be silica, mullite, alumina, SiC, carbon fibers, $MgO$—$Al_2O_3$—$SiO_2$, $Al_2O_3$—$SiO_2$, $MgO$—$Al_2O_3$—$SiO_2$—$Li_2O$, or the like.

In addition, after the polymer of the pre-cured film layer 130 is completely cured, some certain chemical properties, mechanical properties and optical properties of the composite structure CS having the pre-cured film layer 130 and the metal nanowires 140 may be provided. For example, a desired adhesion strength between the composite structure CS and the substrate 110 is provided, as well as the mechanical strength. Therefore the pre-cured film layer 130 is also called a matrix layer or a filler layer. On the other hand, the pre-cured film layer 130 may be made of certain types of polymers, such that the composite structure CS may have an additional surface protection, such as scratch resistance and abrasion resistance. In this circumstance, the pre-cured film layer 130 may be called an overcoat (OC). In one embodiment, the composite structure CS made of epoxy resins, polyurethanes, polysilanes, polysiloxanes, or poly(silicon-acrylic) may have a higher surface strength, such that the scratch resistance is higher. Furthermore, a crosslinking agent, a polymerization inhibitor, a stabilizer (such as antioxidant or UV stabilizer, but not limited thereto), a surfactant, a mixture thereof, or the like may be added in the pre-cured film layer 130 or the polymer to increase the UV-resistance or the durability of the composite structure CS. In another example, the pre-cured film layer 130 may further include a corrosion inhibitor. However, the description above merely provides some possible additives of the pre-cured film layer 130, as well as their compositions, additional functions and names, but the present disclosure is not limited thereto. It is noted that as the UV light stabilizer may be added in the photosensitive polymer, the precision of the subsequent exposing and developing that are performed on the pre-cured film layer 130 may be influenced. However, the influenced exposure precision, which is caused by the UV light stabilizer, is reduced by adjusting parameters in the exposing process, such as exposure intensities.

Next, a photolithography step is performed. In the present disclosure, considering the photosensitivity of the pre-cured film layer 130, the pre-cured film layer 130 is subjected to an exposing process and a developing process (or collectively called a photolithography step) for patterning the metal nanowire layer 140A with the pre-cured film layer 130. The photolithography step may include the following steps. Step S3, exposing the pre-cured film layer 130 to define a reserved region 130A and a removal region 130B. Then, Step S4, removing the pre-cured film layer 130 in the removal region 130B and simultaneously removing the metal nanowire layer 140A underneath the removed pre-cured film layer 130. In other words, both the pre-cured film layer 130 and the metal nanowire layer 140A in the removal region 130B are removed, such that the metal nanowire layer 140A is patterned. In one embodiment, the pre-cured film layer 130 and the metal nanowire layer 140A in the removal region 130B are removed by using a developer (or a release agent). The patterned pre-cured film layer 130 and the metal nanowire layer 140A form a touch sensing electrode TE on the display area VA, and the bonding pad 170 in the peripheral area PA is exposed because the materials of the overcoat and metal nanowires on the bonding pad 170 are removed. More specifically, the developer is used to remove the pre-cured film layer 130 in the removal region 130B, such that the exposed metal nanowire layer 140A under the removed pre-cured film layer 130 in the removal region 130B is stripped by the developer as well. Accordingly, the metal nanowire layer 140A is pattered to form the touch sensing electrode TE on the display area VA and the materials of the pre-cured film layer 130 and metal nanowire layer 140A on the bonding pad 170 are removed so as to expose the bonding pad 170 in the peripheral area PA. In other examples, the pre-cured film layer 130 and the metal nanowire layer 140A in the removal region 130B may be removed by using a combination of the developer and suitable chemicals, such as solvents. The developing process in the context is those well known in the art. For example, in the negative-type pre-cured film layer 130, the portion of the pre-cured film layer 130 that receives light can undergo some chemical reactions to reinforce the chemical bonding in the pre-cured film layer 130. On the contrary, the portion of the pre-cured film layer 130 that does not receive light is easily dissolved away by the developer. In other words, for the negative-type pre-cured film layer 130, the unmasked region of the pre-cured film layer 130 that is exposed to light is defined as the reserved region 130A, whereas the masked region of the pre-cured film layer 130 that is not exposed to light is stripped away to be defined as the removal region 130B.

Figure 5:
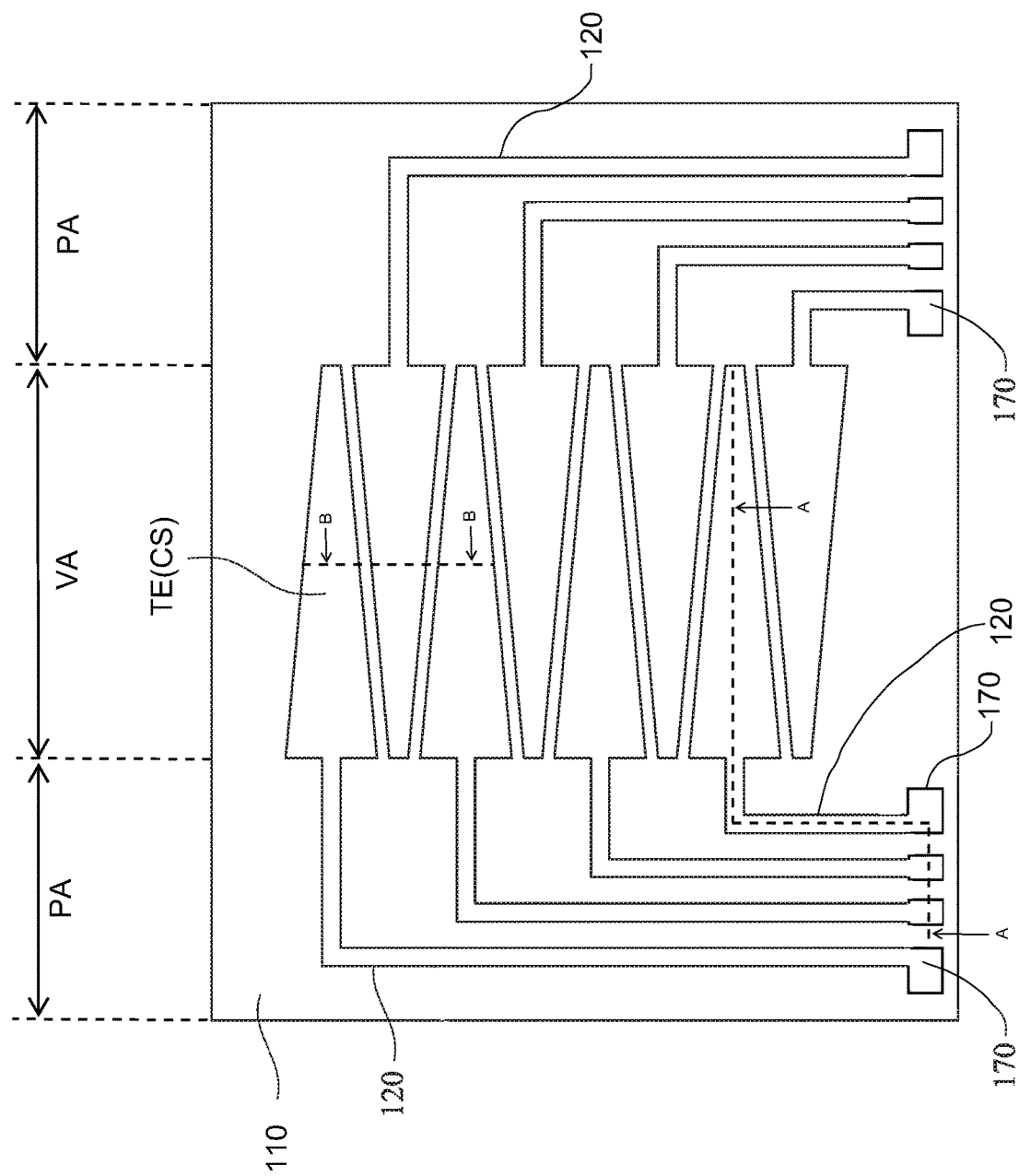
FIG. 5 is a schematic top view of a touch panel according to some embodiments of the present disclosure.
Figure 5A:
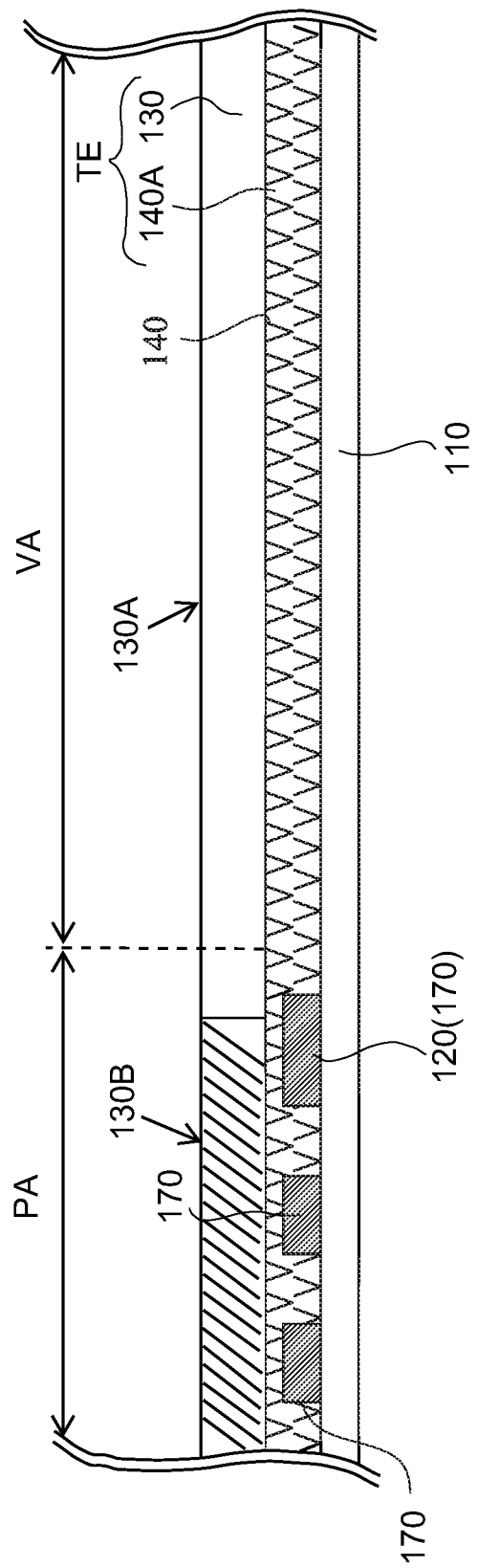
FIG. 5A is a schematic sectional view along line A-A of FIG. 5 according to step S3 of the manufacturing method in FIG. 1.
Figure 5B:
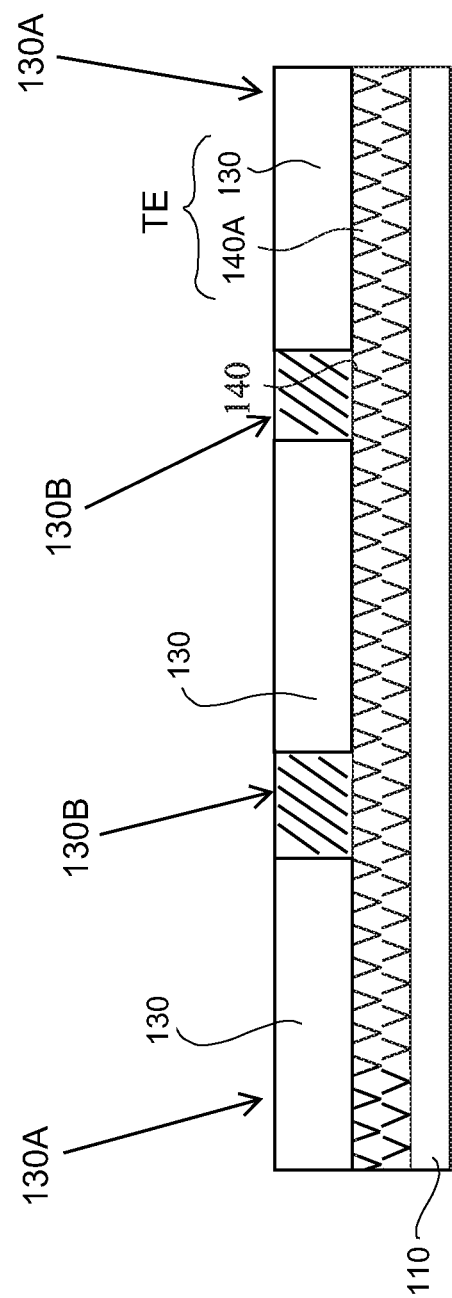
FIG. 5B is a schematic sectional view along line B-B of FIG. 5 according to step S3 of the manufacturing method in FIG. 1.

FIG. 5 illustrates a touch panel manufactured in an example of the present disclosure. Step S3 and step S4 are described along with the sectional views along line A-A and line B-B of FIG. 5. FIG. 5A and FIG. 5B are schematic sectional views along line A-A and line B-B of FIG. 5 respectively after the removal region 130B is defined (i.e., after the exposure process of the pre-cured film layer 130). The sectional view along line A-A of FIG. 5 illustrates the removal region 130B in both the display area VA and the peripheral area PA. The sectional view along line B-B illustrates the removal region 130B in the display area VA. As shown in FIG. 5A and FIG. 5B, a removal region 130B and a reserved region 130A are defined in both the display area VA and the peripheral area PA in the exposing process. In other words, the pre-cured film layer 130 in the display area VA has a defined removal region 130B and a defined reserved region 130A after the exposing process, and also the pre-cured film layer 130 in the peripheral area PA has a defined removal region 130B and a defined reserved region 130A after the exposing process. The materials, including the pre-cured film layer 130 and the metal nanowire layer 140A, in the removal region 130B will be removed afterward, namely the developing process. In the display area VA, the pre-cured film layer 130 and the metal nanowire layer 140A in the reserved region 130A will form a transparent conductive layer in subsequent processes. The transparent conductive layer may further perform as the touch sensing electrode TE.

Figure 6A:
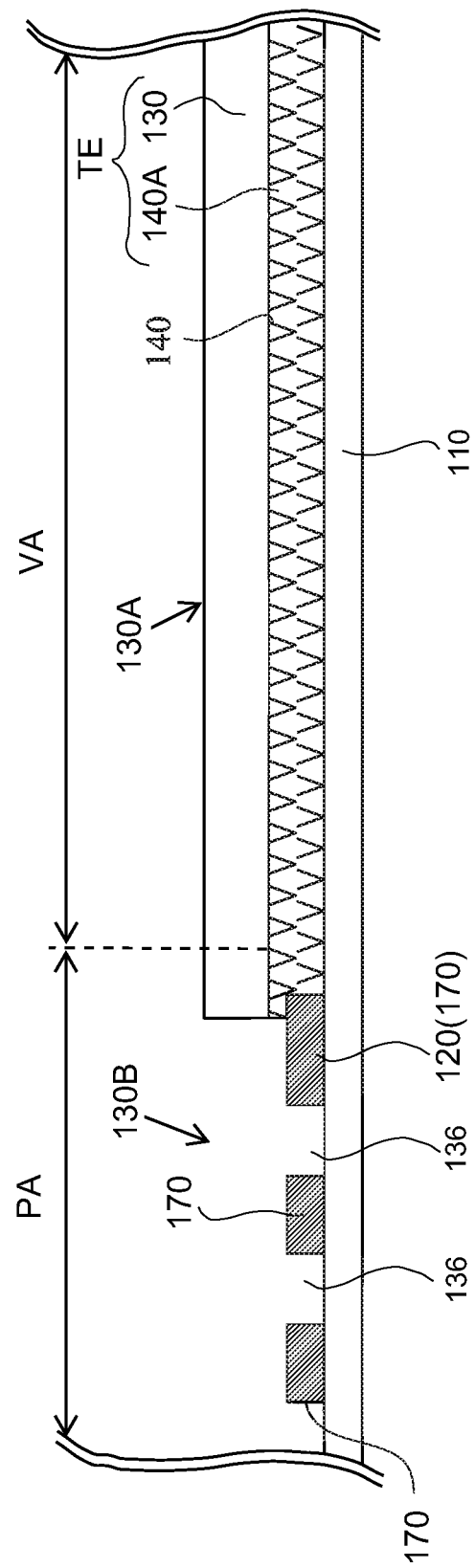
FIG. 6A is a schematic sectional view along line A-A of FIG. 5 according to step S4 of the manufacturing method in FIG. 1.
Figure 6B:
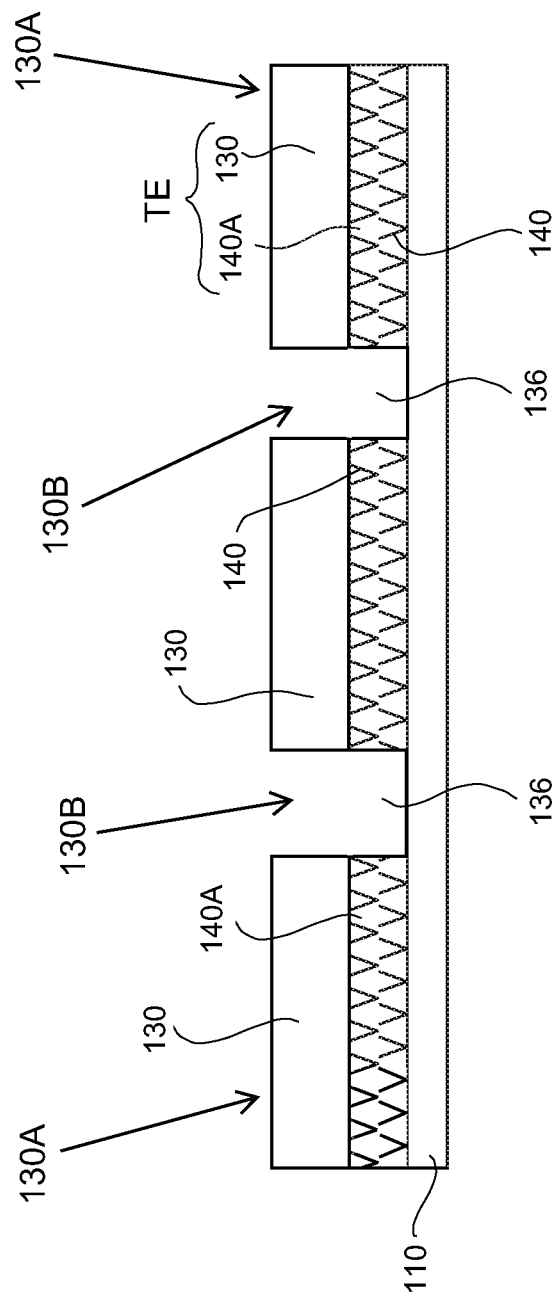
FIG. 6B is a schematic sectional view along line B-B of FIG. 5 according to step S4 of the manufacturing method in FIG. 1.

In one embodiment, at step S3, a pattern-defining step is performed. In detail, the pre-cured film layer 130 is covered by a mask, and a pattern of the mask is transferred to the pre-cured film layer 130 by using an exposure source (for example, an UV light source) outputting an exposure energy of about 200 mJ/cm$^2$ to about 5000 mJ/cm$^2$, such that the removal region 130B and the reserved region 130A are defined. The pre-cured film layer 130 is a photosensitive layer; for example, the layer 130 has negative photosensitivity, but not limited thereto. Therefore, the removal region 130B is a masked region, i.e., an unexposed region, and the reserved region 130A is a masked region, i.e., an exposed region. Next, at step S4, a stripping or a removing step is performed. In detail, a suitable developer is used to remove the pre-cured film layer 130/metal nanowire layer 140A in the removal region 130B. For example, the pre-cured film layer 130/metal nanowire layer 140A in the removal region 130B may be stripped away by using xylene ($C_6H_4(CH_3)_2$), butyl acetate, an aromatic hydrocarbon solvent, or the like. FIG. 6A and FIG. 6B are the sectional views along line A-A and line B-B of FIG. 5 respectively after stripping the pre-cured film layer 130/metal nanowire layer 140A in the removal region 130B. FIG. 6A and FIG. 6B also show the structure of the touch panel manufactured in the embodiment of the present disclosure.

After S4, namely the developing step, the method may further include post-processing steps. One of the post-processing steps is performed to completely remove the metal nanowire layer 140A in the removal region 130B if remaining metal nanowires are found. Since the pre-cured film layer 130 protecting the metal nanowire layer 140A is removed in the exposing process and the developing process (i.e., the removal region 130B is formed), the metal nanowire layer 140A in the removal region 130B may be completely removed by a suitable post-processing step. In one example, the post-processing step may include removing the remaining metal nanowire layer 140A in the removal region 130B by soaking the metal nanowires in the solvent. Examples of the solvent include an organic solution (for example, isopropyl alcohol (IPA), diacetone alcohol (DAA), N-Methyl-2-Pyrrolidone (NMP), or a similar solution) or an alkaline solution (for example, tetramethylammonium hydroxide (TMAH), $Na_2CO_3$, or a similar solution). Alternatively, the post-processing step may include using a solvent in a mechanical approach to remove the remaining metal nanowire layer 140A in the removal region 130B, such as spraying the solution on the target through a nozzle or a soaking process of an ultrasonic oscillation. In another example, the post-processing step may include using an adhesive or similar tool to remove the remaining metal nanowire layer 140A in the removal region 130B. In another example, the post-processing step may further include using a microwave radiation process, a UV radiation process (for example, Excimer 172UV cleaning/treatment system), or a similar process to remove the metal nanowire layer 140A in the removal region 130B and also remove the metal nanowires 140 on the boundary between the removal region 130B and the reserved region 130A. In other words, the metal nanowires 140 that protrude from the side surface of the pre-cured film layer 130 on an etching line are removed.

It is noted that the metal nanowire layer 140A in the removal region 130B may be totally stripped by the developer solution during the developing process, and thereby the pre-cured film layer 130 and the metal nanowire layer 140A in the removal region 130B are removed from the substrate 110. In other words, an integrated developing step is performed to remove the pre-cured film layer 130 and the metal nanowire layer 140A in the removal region 130B simultaneously using a developer. The composite layer of pre-cured film layer 130 and the metal nanowire layer 140A is therefore patterned to fabricate a touch sensing electrode TE in the display area VA. Alternatively, an additional removing step or a second removing step may be further performed as the post-processing steps to remove any remaining metal nanowires 140 if necessary. In other words, in the present disclosure, the timing for removing the metal nanowire layer 140A in the removal region 130B is not limited. Any patterning process that can pattern the metal nanowire layer 140A by a developing solution or solvents without using etching solution is within the scope of the present disclosure.

Please focus on the peripheral circuit 120. In one example, as shown in FIG. 5A and FIG. 6A, the position of the removal region 130B in the peripheral area PA corresponds to the bonding pads 170 of the peripheral circuit 120. Therefore, after step S3 and step S4, the bonding pads 170 are exposed since the metal nanowires 140 and the pre-cured film layer 130 that are previously on the bonding pads 170 are stripped away. Therefore, in subsequent steps (i.e., a bonding step) where an exterior circuit board 180 having an exterior controller, such as flexible printed circuit board (FPC), is connected to the touch panel of the present disclosure, the bonding pads 170 may contact and be directly soldered with the electrode pad (not shown) of the flexible printed circuit board. In other embodiments, auxiliary soldering layers (not shown) may be formed on the bonding pad 170, and then the bonding pad 170 is bonded with the flexible printed circuit board. Alternatively, a conductive adhesive (for example, an anisotropic conductive adhesive, not shown) is formed between the bonding pads 170 and the electrode pads (not shown) of the flexible printed circuit board for signal transmission. Therefore, since the metal nanowires 140 and the pre-cured film layer 130 on the bonding pad 170 are completely removed, a directly contacting and low-impedance signal transmission path (please refer to FIG. 9) is formed between the bonding pad 170 and the electrode pad (not shown) of the exterior circuit board 180a. The signal transmission path may transmit a control signal and a touch sensing signal between the touch sensing electrode TE and the exterior controller. Because of the low impedance of the signal transmission path, the signal transmission loss may be reduced, thereby eliminating the high contact impedance issue in a conventional structure having remaining insulation layer on the bonding pads. In the present example, the metal nanowires 140 and the pre-cured film layer 130 on the peripheral circuits 120 and the metal nanowires 140 and the pre-cured film layer 130 between adjacent peripheral circuits 120 are completely removed as well. In other words, the metal nanowires 140 and the pre-cured film layer 130 coated on the peripheral area PA at step S1 are completely removed, and a formed gap (which is called an insulating region or an non-conductive region 136 hereinafter) may be formed between adjacent peripheral circuits 120. Because the metal nanowires 140 and the pre-cured film layer 130 are not present in the non-conductive region 136 between adjacent peripheral circuits 120, an electrical isolation between adjacent peripheral circuits 120 thus results, and thereby a circuit configuration for single transmission is obtained. In other words, the non-conductive region 136 is formed between the first peripheral electrode of the peripheral circuit 120 and the second peripheral electrode of the peripheral circuit 120.

In addition, as shown in FIG. 5B, FIG. 6B and FIG. 5, the position of the removal region 130B in the display area VA corresponds to the insulating region (i.e., the non-conductive region 136 hereinafter) between adjacent touch sensing electrodes TE to define the touch sensing electrodes TE which are used for sensing touching positions on the devices. In other words, the non-conductive region 136, in the embodiment, between adjacent touch sensing electrodes TE does not have the metal nanowires 140 and the pre-cured film layer 130. A gap is formed between adjacent touch sensing electrodes TE.

In one example, the metal nanowires 140 in the non-conductive region 136 are not completely removed. In other words, the metal nanowires 140 remain in the removal region 130B after the step of stripping by the developer solution, and the concentration of the remaining metal nanowires 140 is lower than a percolation threshold. The electric conductivity of the composite structure of the pre-cured film layer 130 and the metal nanowires 140 is controlled at least by the following factors: a) the conductivity of a single metal nanowire 140, b) the number of metal nanowires 140, and c) the connectivity (also called a contact) between the metal nanowires 140. When the concentration of the remaining metal nanowires 140 is lower than a percolation threshold, the connectivity of the metal nanowires 140 is not enough for generating a continuous electric current path. Thus, the overall conductivity of the material in the removal region 130B is too low to form a conductive network. As a result, the metal nanowires 140 in the removal region 130B form a non-conductive network so as to define the non-conductive region 136. In one embodiment, an area or a structure is considered as being non-conductive in the following exemplary sheet resistance. The sheet resistance is higher than $10^8$ ohm/square, or higher than $10^4$ ohm/square, or higher than 3000 ohm/square, or higher than 1000 ohm/square, or higher than 350 ohm/square, or higher than 100 ohm/square.

In one embodiment, after step S4, a curing step may be included, such that the patterned pre-cured film layer 130 is cross-linked and completely cured. In one example, the curing step includes a UV light irradiation operation (the intensity is about 100 mJ/cm$^2$ to about 1500 mJ/cm$^2$) or a heating operation (under a temperature of about 130° C. to about 150° C. and a duration of about 10 minutes to about 15 minutes). In other words, the remaining pre-cured film layer 130 is fully cured as a solid film, and the composite structure CS having the fully cured film layer 130 and the metal nanowires 140 is formed. The metal nanowires 140 may provide for a conductive network in the film layer 130. In other words, a so-called transparent conductive layer, which contains the film layer 130 and the metal nanowires 140 is formed. After the abovementioned patterning process, the transparent conductive layer may be patterned as touch sensing electrodes TE in the display area VA. For achieving a high display performance, the composite structure CS having the metal nanowires 140 and the pre-cured film layer 130 may have a transmission (i.e., the transmission in range of visible lights) greater than about 80% and a surface resistance of about 10 ohm/square to about 1000 ohm/square. In one embodiment, the transmission is greater than about 85% and a surface resistance of about 50 ohm/square to about 500 ohm/square.

Accordingly, a touch panel that can be used for touch sensing is fabricated. The touch panels includes the touch sensing electrode TE (i.e., the composite structure CS having the film layer 130 and the metal nanowires 140) formed in the display area VA of the substrate 110 and the peripheral circuits 120 formed in the peripheral area PA of the substrate 110. The touch sensing electrode TE is electrically connected to the peripheral circuits 120 to transmit signals. In the present embodiment, the metal nanowire layer 140A of the touch sensing electrode TE has a lap joint structure on the peripheral circuit 120 at a boundary of the display area VA and the peripheral area PA. In detail, as shown in FIG. 6A, the metal nanowire layer 140A of the touch sensing electrode TE slightly protrudes from the display area VA to the peripheral area PA, such that one end of the metal nanowire layer 140A climbs on and contacts the peripheral circuit 120. In other words, the peripheral area PA can be roughly divided into a first region and a second region. The first region refers to the reserved region 130A, where the touch sensing electrode TE (i.e., the composite structure CS having the film layer 130 and the metal nanowires 140) may extend to, and the extended portion of the touch sensing electrode TE forms a lap joint structure on the peripheral circuit 120. The second region refers to the removal region 130B. The peripheral circuit 120 is mainly disposed in the removal region 130B. Therefore besides of the lap joint portion, the pre-cured film layer 130 and the metal nanowires 140 are removed from the peripheral circuits 120 (including the bonding pad 170) and also from the non-conductive region 136 between adjacent peripheral circuits 120.

In another embodiment, the metal nanowire layer 140A and the film layer 130 of the touch sensing electrode TE may extend to the peripheral area PA and cover the peripheral circuits 120. In other words, the metal nanowire layer 140A and the film layer 130 not only occupy the lap joint region but also the surfaces of the peripheral circuits 120. However, the bonding pad 170 is not covered by the pre-cured film layer 130 and the metal nanowires 140 for directly contacting with electrodes on an external FPC. In other words, the peripheral area PA can be roughly divided into a first region and a second region. The first region refers to the reserved region 130A which has a corresponding size and position to the peripheral circuits 120 (the bonding pad 170 is not included), such that the touch sensing electrode TE (i.e., the composite structure CS having the film layer 130 and the metal nanowires 140) may extend to the peripheral area PA and cover the peripheral circuits 120, whereas the bonding pad 170 is not covered by the touch sensing electrode TE. The second region refers to the removal region 130B. Both the bonding pad 170 and the non-conductive region 136 between adjacent peripheral circuits are located in the removal region 130B, such that the film layer 130 and the metal nanowires 140 are removed from the bonding pad 170 of the peripheral circuit 120 and the non-conductive region 136. Overall, the pre-cured film layer 130 and the metal nanowires 140 in the peripheral area PA may have various structural configurations. Those structural configurations in which the bonding pad 170 is exposed are included in the scope of the present disclosure.

Since the film layer 130 does not remain on the bonding pad 170, the contact impedance issue resulting from the film layer 130 may be solved. Therefore, the process of forming the pre-cured film layer 130 (such as deposition time) can be controlled to increase the thickness of the pre-cured film layer 130. With a thicker film layer 130, the metal nanowires 140 are sufficiently protected from oxidation, moisture, and acidic or alkali environment. In one example, the thickness of the pre-cured film layer 130 may be about 40 nm to about 400 nm or about 200 nm to about 400 nm. The thickness range of the pre-cured film layer 130 is broader than the thickness range of the conventional film, and the maximum thickness (for example, 400 nm) may drastically increase the protection of the metal nanowires 140 provided by the pre-cured film layer 130.

In one embodiment, the formed metal nanowires 140 may be further treated to increase their electrical conductivity, and the subsequent processing can be a process including, for example, heating, plasma, corona discharge, UV ozone, or pressure. For example, after the curing step for forming the metal nanowire layer 140A, a roller may be used to apply pressure thereto. In one embodiment, 50 to 3400 psi of pressure may be applied to the metal nanowire layer 140A by one or more rollers, and 100 to 1000 psi, 200 to 800 psi, or 300 to 500 psi of pressure may be applied. In some embodiments, the post treatment of heating and pressure may be performed simultaneously. More specifically, the formed metal nanowires 140 may be pressurized by one or more rollers and also heated at the same time. For example, pressure applied by a roller may be in a range from 10 to 500 psi or from 40 to 100 psi, and the roller is heated to a temperature in a range from about 70° C. to about 200° C. at the same time or in a range from about 100° C. to about 175° C. The post processes are applied to improve at least the conductivity of the metal nanowire layer 140A. In some embodiments, the metal nanowires 140 may be exposed to reducing agents in a process of the post treatment. For example, the metal nanowires 140 made of silver nanowires can be exposed to a silver reducing agent. The silver reducing agent includes borohydride, such as sodium borohydride; boron nitrogen compound, such as DMAB; or gaseous reducing agent, such as (hydrogen) $H_2$. The time period of the exposure is in a range from about 10 seconds to about 30 minutes or from about 1 minute to about 10 minutes. The above-mentioned step of applying pressure may be performed before or after the step of coating the film layer 130, depending on requirements.

As shown in FIG. 5, the touch panel in the present example is a single-sided, non-cross touch panel having one or more touch sensing electrodes TE. Specifically, in the display area VA, a plurality of touch sensing electrodes TE extend in the same direction. Each of the touch sensing electrodes TE is a long and straight electrode having the film layer 130 and the metal nanowires 140. The non-conductive region 136 defined by the removal region 130B is formed between adjacent touch sensing electrodes TE. The non-conductive region 136, similarly, in the peripheral area PA, electrically insulates adjacent peripheral circuits 120. The metal nanowire layer 140A of the touch panel can be patterned directly without using etching solution. The touch sensing electrodes TE in the display area VA are designed for sensing the touching spot or gestures of the user. Meanwhile, the peripheral circuits 120 in the peripheral area PA are electrically connected to the touch sensing electrodes TE, such that controlling signals and touch-sensing signals detected by the touch sensing electrode TE can be transmitted between the exterior controller (not shown) and the device. The film layer 130 and the metal nanowires 140 are not present on the bonding pads 170 of the peripheral circuits 120, and therefore the bonding pads 170 may be directly in contact with or connected to the electrode pads of the exterior circuit board 180 (not shown). As a result, the electrical impedance of the touch panel in the present embodiment is reduced, and the performance of signal transmission is improved. In addition, the thickness of the pre-cured film layer 130 of the touch sensing electrode TE in the display area VA is greater than that of the conventional structure, so that the oxidation resistance, moisture resistance, acid and alkali resistance of the touch panel are improved, and thus the duration and reliability of the products are increased.

Figure 7:
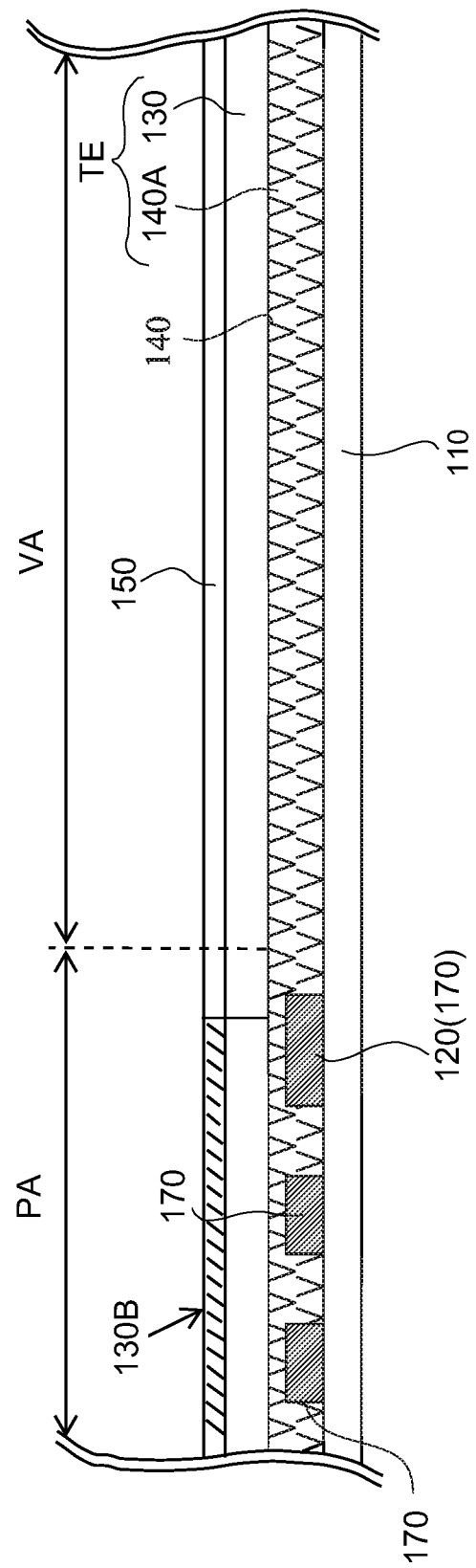
FIG. 7 is a schematic view of yet another aspect of the present disclosure.

In an modified embodiment, in order to increase the photosensitivity of the pre-cured film layer 130 and to further increase the precision (or resolution) of the patterning process, a negative-type photosensitive layer 150 may be disposed on the pre-cured film layer 130 after step S2. FIG. 7 is a schematic view along line A-A of FIG. 5, which shows after the exposure process at step S3. The reserved region 130A and the removal region 130B are defined with the negative-type photosensitive layer 150. The method may include but not limited to the following steps: coating a negative-type photosensitive material on the pre-cured film layer 130 by a screen printing process, a spray coating process, a roller coating process, and the like, followed by a heating process under about 80° C. to about 120° C., such that the negative-type photosensitive material is cured as the negative-type photosensitive layer 150. The negative-type photosensitive layer 150/the pre-cured film layer 130 are then patterned by using exposure energy of about 50 mJ/cm$^2$ to about 1000 mJ/cm$^2$, and the metal nanowires 140 in the removal region 130B are removed by using the procedure described above. In the present embodiment, with greater photosensitivity of the negative-type photosensitive layer 150 than that of the pre-cured film layer 130, the exposure energy can be lower than that of the previous embodiment. Meanwhile, a pattern with smaller line width or line interval may be produced by using the negative-type photosensitive layer 150. For example, the resolution of the pre-cured film layer 130 is about 20 μm or above, and the resolution of the negative-type photosensitive layer 150 is about 10 μm or 5 μm. In the process of removing/stripping the negative-type photosensitive layer 150 in the removal region 130B by using a developer, at least one of the pre-cured film layer 130 or the metal nanowire layer 140A in the removal region 130B can be removed as well, such that a pattern of the metal nanowire layer 140A is obtained. In one example, the pre-cured film layer 130 may not have photosensitivity. While removing the negative-type photosensitive layer 150 in the exposure region by using a developer, at least one of the un-photosensitive pre-cured film layer 130 or the metal nanowire layer 140A are removed as well, such that a pattern of the metal nanowire layer 140A is obtained. The developer may be an organic solvent, such as xylene, n-Butyl Acetate (nBA), and the like. In addition, by introducing the negative-type photosensitive layer 150 in the structure, the impact resulting from the UV light stabilizer added in the film layer 130 to the resolution of the exposure process and the developing process is avoided. From the aspect of the product properties, the UV light stabilizer may be added in the film layer 130 depending on the application of the product, such that the product may further have UV-light resistance properties. In one example, the adhesion strength between the negative-type photosensitive layer 150 and the structure of the pre-cured film layer 130 and the metal nanowire layer 140A is greater than the adhesion strength between the substrate 110 and the structure of the pre-cured film layer 130 and the metal nanowire layer 140A. Therefore, during the removal of the negative-type photosensitive layer 150, the pre-cured film layer 130 and the metal nanowire layer 140A thereunder may be removed simultaneously.

Moreover, due to the properties of the negative-type photosensitive layer 150, the exposed negative-type photosensitive layer 150 has stronger chemical bonding and therefore is not readily dissolved by the developer. Therefore, after the patterning process, the negative-type photosensitive layer 150 in the reserved region 130A remains on the film layer 130 and the metal nanowire layer 140A. For example, the negative-type photosensitive layer 150 remains on the touch sensing electrode TE in the display area VA. In addition, because of the presence of the negative-type photosensitive layer 150, the metal nanowire layer 140A is provided with greater protection. For example, after the curing process, the thickness of a protective layer formed of the negative-type photosensitive layer 150 and the pre-cured film layer 130 may be 5 µm to 10 µm, and therefore the product durability is drastically increased. In another example, a removing step of the remaining negative-type photosensitive layer 150 may be further included.

In yet another example, the metal nanowire layer 140A and the film layer 130 of the touch sensing electrode TE may further extend to the peripheral area PA and cover the peripheral circuits 120. The bonding pad 170 is not covered by the metal nanowire layer 140A and the film layer 130. The negative-type photosensitive layer 150 is stacked on the composite structure CS having the metal nanowire layer 140A and the film layer 130. In other words, the peripheral area PA may be divided into a first region and a second region. The first region refers to the reserved region 130A which has corresponding size and position to the peripheral circuit 120 (however, the bonding pad 170 is not included), such that the touch sensing electrode TE (i.e., the composite structure CS having the film layer 130 and the metal nanowires 140) may extend to cover the peripheral circuits 120 in the peripheral area PA, whereas the bonding pad 170 is not covered by the touch sensing electrode TE. The negative-type photosensitive layer 150 may be formed to cover the composite structure CS. The second region is the removal region 130B. The bonding pad 170 and the non-conductive region 136 between adjacent peripheral circuits 120 are located in the removal region 130B, such that the film layer 130 and the metal nanowires 140 are not present on the bonding pad 170 and the non-conductive region 136.

The description of the foregoing examples, such as the post-processing step, may be implemented in the present example, and therefore are not repeated herein.

Figure 8:
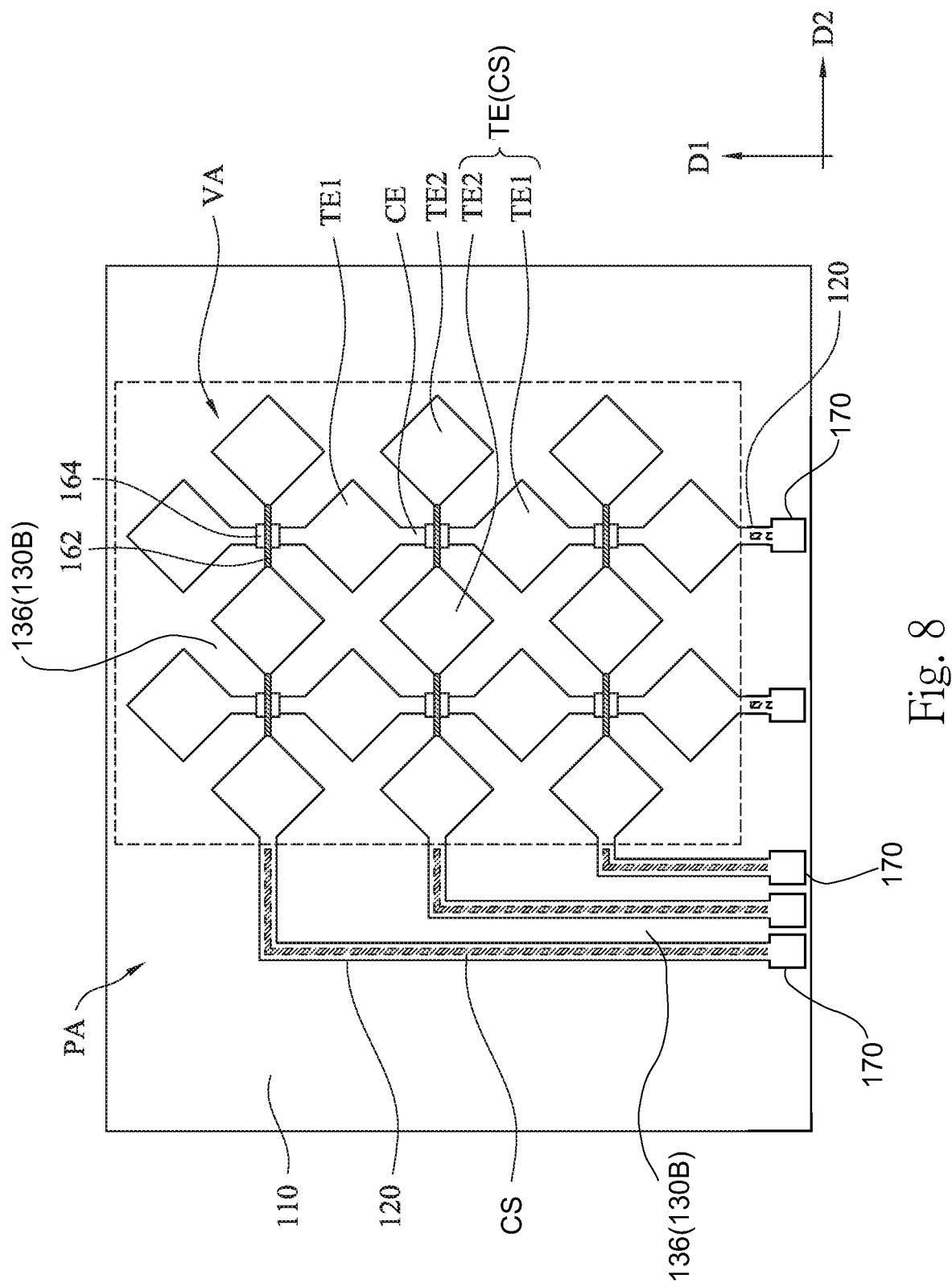
FIG. 8 is a schematic top view of a touch panel according to some embodiments of the present disclosure.

FIG. 8 illustrates another example of the touch panel in the present disclosure. The touch panel is a single-sided touch panel with bridge structures. The difference between the present example and the previous example is described below. The touch sensing electrode TE, which is formed by patterning a transparent conductive layer (i.e., the composite structure CS having the film layer 130 and the metal nanowires 140) on the substrate 110 includes: a first touch sensing electrode TE1 arranged along a first direction D1, a second touch sensing electrode TE2 arranged along a second direction D2, and a connecting electrode CE electrically connecting adjacent ones of the first touch sensing electrodes TE1. As the thickness of the pre-cured film layer 130 of the connecting electrode CE is sufficient (such as >40 nm), the film layer 130 of the connecting electrode CE can be used as an insulating material, and a bridging wire 162 may be directly disposed on a corresponding insulating connecting electrode CE to connect adjacent second touch sensing electrodes TE2 along the second direction D2. Alternatively, an insulating block 164, such as silicon dioxide, may be disposed on the connecting electrode CE, and then the bridging wire 162, such as copper, may be disposed on the insulating block 164. The bridging wire 162 connects adjacent second touch sensing electrodes TE2 in the second direction D2. The insulating block 164 is disposed between the connecting electrode CE and the bridging wire 162, such that the connecting electrode CE and the bridging wire 162 are electrically insulated to each other, and the touch electrodes in the first direction D1 and the touch electrodes in the second direction D2 are electrically insulated to each other. It is noted that concerning the electrical insulation which may arise because of the film layer 130 of the second touch sensing electrode TE2, a via hole (not shown) may be fabricated in the film layer 130 of the second touch sensing electrode TE2. Both ends of the bridging wire 162 are connected through the via hole, such that the bridging wire 162 may electrically connect adjacent ones of the second touch sensing electrodes TE2 in the second direction D2.

Moreover, as shown in the example of FIG. 8, the composite structure CS having the film layer 130 and the metal nanowires 140 may be disposed to cover the peripheral circuit 120 in the peripheral area PA, whereas the bonding pad 170 is exposed. The details are provided above and therefore are not repeated herein.

In another example, the first touch sensing electrode TE1, the second touch sensing electrode TE2 and the connecting electrode CE are covered by the negative-type photosensitive layer 150. Because the total thickness of the film layer 130 of the connecting electrode CE and the remaining negative-type photosensitive layer 150 is sufficient (such as >5 µm), and therefore the film layer 130 of the connecting electrode CE and the remaining negative-type photosensitive layer 150 may serve as an insulating material. The bridging wire 162 may be directly disposed on the negative-type photosensitive layer 150 to connect adjacent second touch sensing electrodes TE2 in the second direction D2. Concerning the electrical insulation which may arise because of the film layer 130 of the second touch sensing electrode TE2 and the remaining negative-type photosensitive layer 150 thereon, a via hole (not shown) may be fabricated in the film layer 130 of the second touch sensing electrode TE2 and the remaining negative-type photosensitive layer 150. Both ends of the bridging wire 162 are connected through the via hole, such that the bridging wire 162 may electrically connect adjacent ones of the second touch sensing electrodes TE2 in the second direction D2.

The process of the present disclosure is also suitable for manufacturing a double-sided touch panel. For example, the peripheral circuit 120 is fabricated on both opposing sides (for example, the upper side and the bottom side) of the substrate 110, and then the metal nanowire layer 140A and the pre-cured film layer 130 are formed on both of the opposing sides of the substrate 110 by the procedure described above. Next, a double-side exposure and developing process is performed, such that a patterned touch sensing electrode TE is formed on both of the opposing sides of the substrate 110. Similar to the previous example, in the peripheral area PA, none of the film layer 130 and the metal nanowires 140 is formed on the bonding pads 170 of the peripheral circuits 120. Therefore, the bonding pads 170 can be directly in contact with or directly connected to electrode pads of the exterior circuit board 180, and the electrical impedance of the touch panel in the present example is reduced. The thickness of the film layer 130 of the touch sensing electrode TE in the display area VA is greater than that of the conventional structure, and therefore the oxidation resistance, moisture resistance, acid and alkali resistance, and organic solvent resistance of the metal nanowires 140 are increased.

In one example, in order to avoid the interference during the exposure process to the film layers 130 on opposing sides of the substrate 110, the light sources are applied in different time sequences during the exposure process. In another example, the light source may have different wavelengths during the exposure process. In other words, the film layers 130 on opposing sides of substrate 110 are photosensitive to different wavelengths. In another example, a light-beam blocking layer (not shown) is formed on opposing sides of the substrate 110, and then the peripheral circuit 120 and metal nanowire layer 140A are formed. Specifically, the light-beam blocking layer is an UV-blocking layer, and the film layers 130 on opposing sides of the substrate 110 may be made of the same polymer. Next, a double-side patterning process is performed by using the two UV light sources with equal wavelength for providing radiation to the film layers 130 on opposing sides of the substrate 110. The UV-blocking layer is able to absorb a portion of UV light of certain wavelength (for example, at least 10%, 20%, 25%, or 20% to 50% of the total energy) and allow the transmission of visible light (for example, a wavelength of 400-700 nm), such as visible light that is greater than 85% of the total energy. In one example, the UV-blocking layer is made of a PET film (trademark: HB3-50, Teijin DuPont Films) with a thickness of 50 μm. Another exemplary UV-blocking layer is a PET film (trademark: XST6758, Teijin DuPont) with a thickness of 125 μm.

In one example, the peripheral circuit 120 is fabricated on both opposing sides of the substrate 110, and then the metal nanowire layer 140A, the film layer 130, and the negative-type photosensitive layer 150 are formed on both of the opposing sides of the substrate 110 by the procedure described above. Next, a double-side exposure and developing process or similar processes are performed, such that patterned touch sensing electrodes TE are formed on the opposing sides of the substrate 110. The process conditions of the double-side exposure process may be applied to the negative-type photosensitive layer 150 in the present example, and therefore are not repeated herein.

Figure 9:
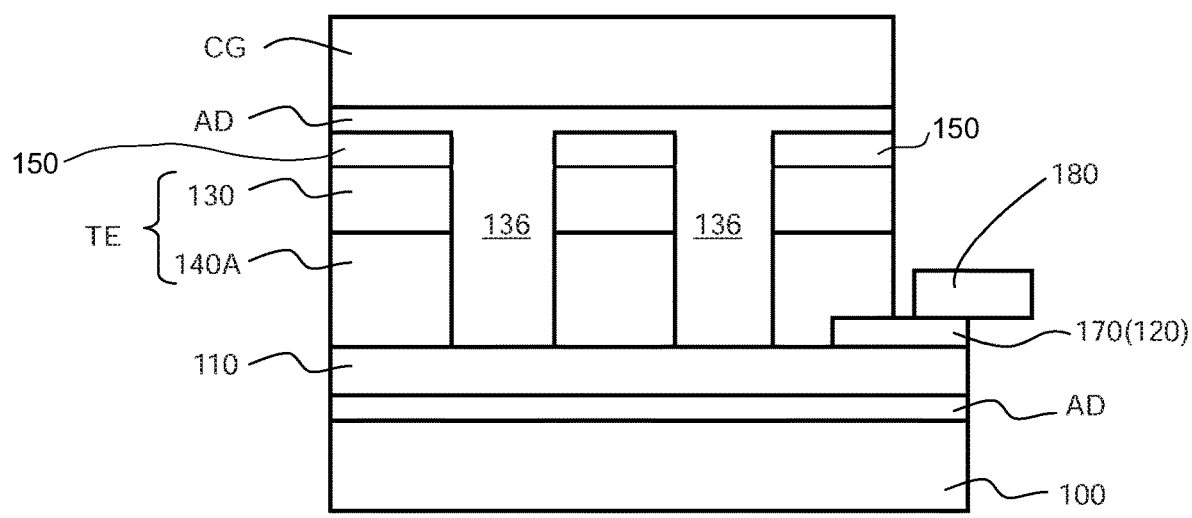
FIG. 9 illustrates a schematic view of a touch panel assembled with an electronic device according to some embodiments of the present disclosure.

FIG. 9 illustrates an exemplary touch panel that is assembled with other electronic devices, such as a display device. The details of the substrate 110, the peripheral circuit 120 (including the bonding pad 170), the negative-type photosensitive layer 150, and the touch sensing electrode TE having the metal nanowire layer 140A and the pre-cured film layer 130 are described above, and therefore are not repeated herein. In addition, a display element 100, such as a liquid crystal display element, can be adhered to the bottom surface of the substrate 110 through an optical clear adhesive (OCA). The negative-type photosensitive layer 150 may also be adhered to a cover glass CG (or a protecting glass) through an optical clear adhesive (OCA). In one embodiment, the optical clear adhesive (OCA) may seep into the non-conductive region 136 between adjacent touch sensing electrodes TE, such that the structural strength is increased. Similar to the previous examples, in the peripheral area PA, the film layer 130, the metal nanowires 140, and the negative-type photosensitive layer 150 are not present on the bonding pads 170 of the peripheral circuits 120. Therefore, the bonding pads 170 may be in direct contact with the electrode pads of the exterior circuit board 180, such that the electrical impedance of the touch panel in the present example is reduced.

In some embodiments of the present disclosure, the pre-cured film layer 130 is used in the patterning process (i.e., the exposure process and the developing process), and the etching liquid is not required. The composite transparent conductive layer having the metal nanowire layer 140A and the pre-cured film layer 130 is patterned simultaneously to form the touch sensing electrode TE in the display area while stripping the pre-cured film layer 130. The conventional etching step of the metal nanowire layer 140A using the etching liquid is omitted, and therefore the drawbacks caused by remaining etching solutions can be avoided, and the production yield is increased.

In some embodiments of the present disclosure, the negative-type photosensitive layer 150 is used in the patterning process (i.e., the exposure process and the developing process), and the etching liquid is not required. The composite transparent conductive layer having the metal nanowire layer 140A and the pre-cured film layer 130 is patterned simultaneously to form the touch sensing electrode TE in the display area while stripping the negative-type photosensitive layer 150. The conventional etching step of the metal nanowire layer 140A using the etching liquid is omitted, and therefore the drawbacks caused by remaining etching solutions can be avoided, and the production yield is increased.

In some embodiments of the present disclosure, the metal nanowire layer 140A is patterned without using etching solutions. Therefore, there is no impact brought by the etching solutions to the components of the touch panel (for example, the peripheral circuit 120 made of metal material, where the corrosion is easily formed in etching solutions).

In some embodiments of the present disclosure, the conventional etching step of the metal nanowire layer 140A is omitted. Therefore the overall processes are simplified, and the production cost is reduced.

In some embodiments of the present disclosure, by completely removing the film layer 130 and the metal nanowires 140 on the bonding pads 170, the bonding pads 170 are in direct contact with the exterior circuit board 180. Therefore, an electrical path having low impedance is formed, such that the signal transmission loss and distortion are reduced.

In some embodiments of the present disclosure, by completely removing the film layer 130, the metal nanowires 140, and the negative-type photosensitive layer 150 on the bonding pads 170, the bonding pads 170 and the exterior circuit board 180 are in direct contact. Therefore, an electrical path having low impedance is formed, such that the signal transmission loss and distortion are reduced.

In some embodiments of the present disclosure, because it is not necessary to be concern with the contact impedance between the bonding pads 170 and the exterior circuit board 180, the thickness of the film layer 130 on the touch sensing electrode in the display area may be increased. The protection provided by the thicker film layer 130 allows the product to become more robust.

In some embodiments of the present disclosure, the durability of the touch sensing electrode in the display area may be increased due to the protection provided by the thicker film layer 130.

In some embodiments of the present disclosure, the durability of the touch sensing electrode in the display area may be increased due to the protection provided by the film layer 130 and the negative-type photosensitive layer 150.

In some embodiments of the present disclosure, the single-sided or double-sided touch panels can be mass-produced by the presented processes.

Although the present disclosure has been described in considerable detail with reference to certain embodiments thereof, other embodiments are possible. It will be apparent to those skilled in the art that various modifications and variations can be made to the structure of the present invention without departing from the scope or spirit of the invention. Therefore, the spirit and scope of the appended claims should not be limited to the description of the embodiments contained herein.

What is claimed is:
1. A direct patterning method for forming a touch panel, comprising:
  providing a substrate having a display area and a peripheral area, wherein a peripheral circuit is disposed in the peripheral area, and the peripheral circuit comprises a bonding pad;

disposing a metal nanowire layer in the display area and the peripheral area, wherein the metal nanowire layer comprises a plurality of metal nanowires;

pre-curing a material as a pre-cured film layer on the metal nanowire layer;

disposing a negative-type photosensitive layer on the pre-cured film layer;

performing a photolithography step, comprising:

exposing the negative-type photosensitive layer to define a removal region and a reserved region; and removing the negative-type photosensitive layer, the pre-cured film layer and the metal nanowire layer in the removal region by using a developer solution, such that a touch sensing electrode electrically connected to the peripheral circuit is fabricated on the display area, and the bonding pad in the peripheral area is exposed, wherein the touch sensing electrode comprises the pre-cured film layer and the metal nanowire layer, and wherein the pre-cured film layer and the metal nanowire layer in the reserved region are covered by the negative-type photosensitive layer; and curing the pre-cured film layer as a film layer.

2. The direct patterning method of claim 1, further comprising a post-processing step to completely remove the metal nanowire layer in the removal region.

3. The direct patterning method of claim 2, wherein the post-processing step comprises using an organic solution or an alkaline solution in a mechanical method to completely remove the metal nanowire layer in the removal region.

4. The direct patterning method of claim 2, wherein the post-processing step comprises using an adhesive to completely remove the metal nanowire layer in the removal region.

5. The direct patterning method of claim 2, wherein the post-processing step comprises using a microwave radiation process or a UV radiation process to completely remove the metal nanowire layer in the removal region.

6. The direct patterning method of claim 1, wherein a photosensitivity of the negative-type photosensitive layer is greater than a photosensitivity of the pre-cured film layer.

7. The direct patterning method of claim 1, wherein an adhesion strength between the negative-type photosensitive layer and a composite structure comprising the pre-cured film layer and the metal nanowire layer is greater than an adhesion strength between the substrate and the composite structure comprising the pre-cured film layer and the metal nanowire layer.

* * * * *